(12) United States Patent
Akiyama et al.

(10) Patent No.: US 8,569,117 B2
(45) Date of Patent: Oct. 29, 2013

(54) SYSTEMS AND METHODS INTEGRATING TRENCH-GATED THYRISTOR WITH TRENCH-GATED RECTIFIER

(71) Applicant: Pakal Technologies, LLC, San Francisco, CA (US)

(72) Inventors: Hidenori Akiyama, Miyagi Sendai (JP); Richard A. Blanchard, Los Altos, CA (US); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 13/648,516

(22) Filed: Oct. 10, 2012

(65) Prior Publication Data

US 2013/0115739 A1   May 9, 2013

Related U.S. Application Data

(60) Provisional application No. 61/545,567, filed on Oct. 10, 2011.

(51) Int. Cl.
*H01L 21/332* (2006.01)

(52) U.S. Cl.
USPC ............... 438/133; 438/137; 257/E29.046; 257/E29.125; 257/E29.196; 257/83

(58) Field of Classification Search
USPC ............ 257/E29.036, E29.037, E29.046, 257/E29.125, E29.196, E29.337, E21.35, 257/79, 80, 81, 82, 83, 84, 85, 431, 432; 438/FOR. 140, 133, 983, 237, 328, 979, 438/137
See application file for complete search history.

(56) References Cited

U.S. PATENT DOCUMENTS

| | | | |
|---|---|---|---|
| 2003/0201455 A1* | 10/2003 | Takahashi et al. | 257/136 |
| 2006/0006459 A1* | 1/2006 | Yoshikawa | 257/330 |
| 2007/0052014 A1* | 3/2007 | Takahashi | 257/330 |

* cited by examiner

*Primary Examiner* — Thanh Y Tran
(74) *Attorney, Agent, or Firm* — Patent Law Group LLP; Brian D Ogonowsky (57) ABSTRACT

An integrated trench-MOS-controlled-thyristor plus trench gated diode combination, in which the trenches are preferably formed at the same time. A backside polarity reversal process permits a backside p+ region in the thyristor areas, and only a backside n+ region in the diode areas (for an n-type device). This is particularly advantageous in motor control circuits and the like, where the antiparallel diode permits the thyristor to be dropped into existing power MOSFET circuit designs. In power conversion circuits, the antiparallel diode can conveniently serve as a freewheeling diode.

20 Claims, 6 Drawing Sheets

Fig 5a : forward static I-V of IGTO

Fig 5b : Reverse static I-V of TGR

SYSTEMS AND METHODS INTEGRATING TRENCH-GATED THYRISTOR WITH TRENCH-GATED RECTIFIER

CROSS-REFERENCE

Priority is claimed from 61/545,567, filed Oct. 10, 2011, which is hereby incorporated by reference.

BACKGROUND

The present application relates to motor drive circuits and the like, and more particularly to thyristor switching devices integrated with an antiparallel diode.

Note that the points discussed below may reflect the hindsight gained from the disclosed inventions, and are not necessarily admitted to be prior art.

Thyristors have long been used for motor control and other high voltage applications. A thyristor is a semiconductor device which has fully bipolar conduction, i.e. both electrons and holes conduct current in the ON-state. By contrast, a simple MOS transistor is a purely unipolar device, i.e. the current is carried entirely (or almost entirely) by electrons in an n-type device. An IGBT (integrated gate bipolar transistor) is a partly bipolar device, in which both carrier types carry current, but the electron current is typically greater than the hole current.

The big difficulty with thyristor circuits is that a thyristor will latch, i.e. once it is turned on it will stay on for as long as voltage across it is enough to cause current to flow. A class of thyristors known as MOS-controlled thyristors (MCTs) provides a thyristor which can be both turned on and turned off by a relatively small signal applied to a gate electrode. The thyristor is a completely bipolar device, and electrons and holes are both emitted from junctions near opposite faces of the semiconductor material. Further information on MOS-controlled thyristors can be found in e.g. issued U.S. Pat. No. 7,705,368 to Rodov and Akiyama, which is commonly owned with the present application.

SUMMARY

The present application discloses new synergistic combinations of a MOS-controlled thyristor with a diode on the same chip. In one particularly advantageous class of embodiments, the thyristor is a MOS-controlled-thyristor which uses a trench gate for control, and the diode is a trench gate rectifier. In addition, the present application discloses techniques which are advantageously used to form this combination. This combination permits a MOS-controllable thyristor and a freewheeling diode to be combined in a single package, with no separate internal leads being required. Moreover, since only one of the thyristor and the diode will normally carry current at a given time, the thermal conductivity which is adequate for protecting the thyristor will generally be adequate to protect the trench gate rectifier also.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

In many power switching tasks, it is useful to have a simple diode which is antiparallel with the conduction of the switching device when it is turned on. In particular, when thyristors are used as the switching device, a thyristor in the on state will in effect act as a PN-junction diode. Therefore, it cannot conduct current in both directions. Thus an additional diode which is antiparallel to the ON-state conduction of the thyristor is often useful, especially for motor drive applications, and also in many power supply and other applications having inductive loads in which current can flow through the device in the reverse direction after the switch opens.

The present application discloses new ways to fabricate, in a single process flow, thyristor plus diode combinations which are conveniently connected together.

A power FET has a built-in antiparallel diode, but an IGBT also has an extra junction, so it does not have this built-in antiparallel diode.

One advantage of the various disclosed inventions is that no additional terminals or internal connections are required to include the freewheeling diode in the same package with the thyristor, since both the thyristor and the diode are connected to the same two current-carrying terminals.

Another advantage is that the heat-sinking requirements of the thyristor will also normally be sufficient (or nearly so) for the thermal heat-sinking requirements of the diode. This behavior occurs because normally the two devices will not be conducting significant currents at the same time.

A further advantage of some or all of the various disclosed inventions is that a very high voltage switching device can be conveniently integrated on the same chip with an appropriately high-voltage diode with only modest additional fabrication cost.

A further advantage is that forming the diode and the thyristor on a single die allows the performance of the diode to be matched to the performance of the thyristor.

A further advantage of some or all of the various disclosed inventions is a reduction of parasitic inductance and parasitic capacitance.

One invention which has facilitated realization of the structures described is a semiconductor processing method whereby a doped layer can be added or bypassed on the backside of the device. For example, in the example embodiment of FIG. 1A, note that the thyristor, which always requires three junctions, conducts from a p++ anode on the backside to an n+ cathode (emitter) diffusion on the front side.

Thus whatever structure is used on the front side to implement both a thyristor with vertical current flow and a diode with vertical current flow, if the main front side contact is common, then it will be necessary to have two different kinds of backside doping polarity.

More specifically, it is particularly advantageous to combine a trench-gated MOS-controlled vertical current flow thyristor with a trench gate rectifier which also has vertical current flow.

As described below, the trench structures in the diode and the thyristor can optionally be fabricated in a single process step. Moreover, since both the thyristor and the diode have a significant thickness of epitaxial material between the trench gate and the contact diffusions on the backside, both can be made to be comparably high-voltage devices. This is synergistic.

A single layer of metallization is preferably used to make the high-current connection on the backside of the device, and a single layer of metal is preferably used to make contact to the current-carrying terminals on the front side. (In the example of FIG. 1A, these are the n+ front side diffusions, which are the NPN emitter, and also the n+ cathode region of the diode.) Another connection is required for the gate drive.

For the layout of the entire die it is most preferable to have the thyristor device and the diode both enclosed in their own separate isolation structures (typically multiple circles of field-limiting rings). Other variations are discussed below.

The disclosed innovations, in various embodiments, provide one or more of at least the following advantages. However, not all of these advantages result from every one of the innovations disclosed, and this list of advantages does not limit the various claimed inventions.

Reduced parasitic reactances

Flyback diode integrated with minority-carrier switch

More economical packaging of high-voltage modules which combine a thyristor with a flyback diode (since only one die needs to be positioned within the package)

Makes thyristors more economical for motor switching and similar applications

Figure 1A:
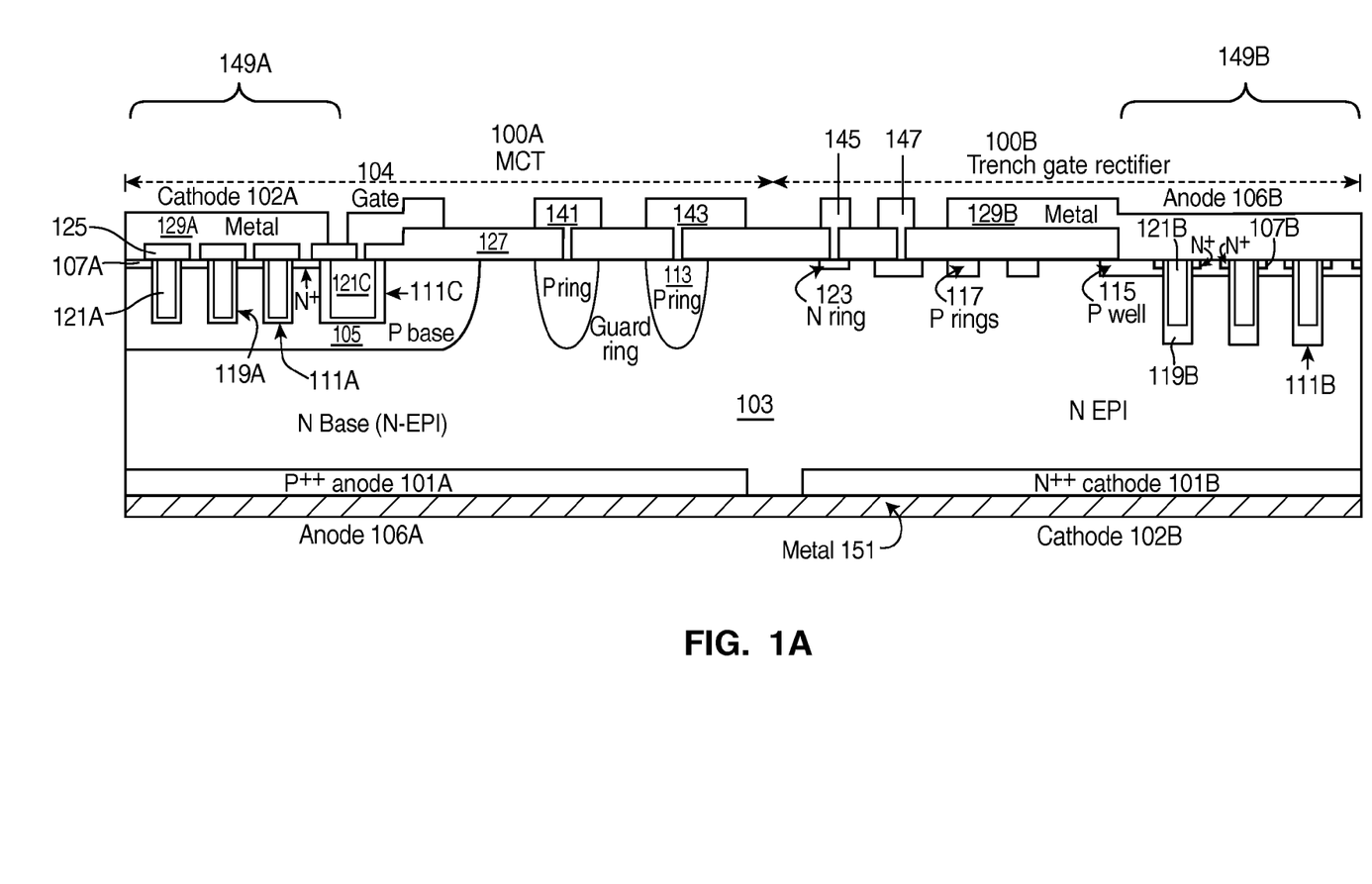
FIG. 1A schematically shows a cross section of an embodiment of the present innovations.

FIG. 1A shows a sample embodiment of the present inventions, in which MOS-controlled thyristor (MCT) 100A and trench gate rectifier (TGR) 100B are fabricated on a single semiconductor die. MOS-controlled thyristor 100A has three terminals (MOS-controlled thyristor cathode 102A, MOS-controlled thyristor anode 106A, MOS-controlled thyristor gate 104), while trench gate rectifier 100B has two terminals (trench gate rectifier cathode 102B and trench gate rectifier anode 106B). Thyristor cathode 102A and diode anode 106B are preferably connected to the same metallization layer 129. Thyristor anode 106A and diode cathode 102B are preferably connected to common metallization layer 151. (Note that diode 100B is oriented oppositely to thyristor 100A.)

The trench gated rectifier 100B has an n+ frontside anode, and a shallow p body region. The gate is an insulated gate, but, in this example, is connected to the n+ anode. Thus the trench-gated rectifier achieves rectification, as will be easily recognized by those skilled in the art.

In one such sample embodiment, P++ anode region 101A under thyristor 100A and N++ cathode region 101B under rectifier 100B can be formed on the backside of the silicon die, under epitaxial N layer 103, using e.g. innovative techniques such as those described below. The doping of the N-type epitaxial layer 103 can be e.g. $10^{13}$-$10^{15}$ cm$^{-3}$. This dopant concentration can be obtained e.g. by in-situ doping during epi growth.

A P-type base region 105 is then formed in MOS-controlled thyristor 100A, e.g. by implantation. Preferably the P guard rings 113 are also formed in the same patterned implant. The peak doping in the P-type base region 105 can be, for example, $10^{16}$-$10^{18}$ cm$^{-3}$.

A P type body region 115 is also implanted in trench gate rectifier 100B. Preferably the P rings 117 are also formed in the same patterned implant. In one example embodiment, P well 115 can have a depth of, e.g., 0.5-1.5 microns, and a peak doping of, for example, $10^{16}$-$5\times10^{18}$ cm$^{-3}$. In another example embodiment, P well 115 can have a depth of, e.g., 10%-80% of the trench depth.

Additional field oxide 127 is then grown to a thickness of, for example, 0.6-1.5 microns. The field oxide 127 is then preferentially etched from the emitter areas 149A and 149B using a masked etch.

A masked implant is used to create the MOS-controlled thyristor shallow N+ layer 107A, and trench gate rectifier shallow N+ layer 107B is preferably created in the same patterned implant. These can be very heavily doped, and can be formed, e.g., by an implant of arsenic or phosphorus at an energy of 10-100 keV and an area dose of $5\times10^{14}$-$10^{16}$ cm$^{-2}$. Preferably the N ring 123 is also formed in the same patterned implant. In one example embodiment, heavy shallow N+ layer 107 has a depth of, for example, 0.1-0.5 microns. In another example embodiment, heavy shallow N+ layer 107 has a depth of, for example, 15%-40% of the depth of the p-type region of the rectifier.

In one example embodiment, the inter-level dielectric 125 in MOS-controlled thyristor 100A is 0.6-1.2 microns thick of silicon dioxide, and the field oxide 127 is 0.6-1.5 microns thick of silicon dioxide. However, these can of course be varied.

Patterning of the inter-level dielectric 125 exposes contact locations, where the MOS-controlled thyristor metal 129A can make contact to a shallow N+ region 107A. The N+ region 107A provides the emitter of the NPN transistor portion of the MOS-controlled thyristor, and also provides ohmic contact to the MOS-controlled thyristor cathode metallization 129A. Trench gate rectifier metal 129B (preferably the same metal thin film layer) can also make contact to a shallow N+ region 107B. The N+ region 107B provides the anode of the diode 100B, and also provides ohmic contact to trench gate rectifier anode metallization 129B. The thyristor cathode metallization 129A and diode anode metallization 129B in this example are an aluminum-copper alloy, but can of course be made of other materials, as is well known. Barrier metallization can also be used at the contacts if desired.

Either before or after the masked implant which forms the shallow N+ regions 107, trenches 111 are etched in the active areas. Preferably, MOS-controlled thyristor trenches 111A and 111C and trench gate rectifier trenches 111B are all formed simultaneously. The gates 111A which are connected to control conduction from the MOS-controlled thyristor cathode 102A through the adjacent part of P base 105 are preferably surrounded by a ring or line or lines of trenches 111C in which contact can be made to the gate electrode. Thus the gate electrode is a buried mesh within the surface of the semiconductor material. Preferably the trench gate contact portions 111C either surround the MOS-controlled thyristor active gate portions 111A, or else totally outflank it. For example, the gate contact trenches can be laid out so that each trench portion is a straight line, and the gate contact trenches are wider than the active area from any viewpoint on the surface.

In one embodiment, the trench depths can be e.g. 2-10 microns, but the minimum lateral trench widths are constrained by lithographic and etching limitations.

After trenches 111 are etched, gate oxides 119 are preferably grown on the sidewalls and bottoms of those trenches.

Preferably, diode-region gate oxide 119B is thicker at the bottoms of trenches 111B than the thyristor-region trench-bottom gate oxide 119A. This is done to improve device performance. These gate oxides 119 in thyristor locations are relatively thin, and can be, for example, 0.05-0.15 microns thick. Conductive material 121, e.g. heavily doped polysilicon, then fills the trenches 111 to form gate electrodes 121A and 121B, and gate contact electrode 121C, and is, in the example shown, planarized to the surface of the semiconductor material.

Note that the voltage withstand requirements of the gate oxides 119 are not as high since the gate electrodes 121A and 121C are close in potential to the cathode metal 102A and gate electrodes 121B are close in potential to cathode metal 102B, and since the structures are preferably architected so that breakdown occurs first at the periphery.

Rectifier gate 121B is preferably tied to N+ source 107B.

One or more second metal regions 141 and 143 preferably make contact to concentric P guard rings 113. This structure helps to assure that when breakdown happens, the fragile gate oxides in the active areas will not be damaged. Similarly, one or more second metal regions 147 preferably make contact to P rings 117, and metal region 145 preferably makes contact to N ring 123. These metal regions are preferably formed in the same process as the cathode metallization for the thyristor and anode metallization for the diode, but can be separately connected.

Figure 1B:
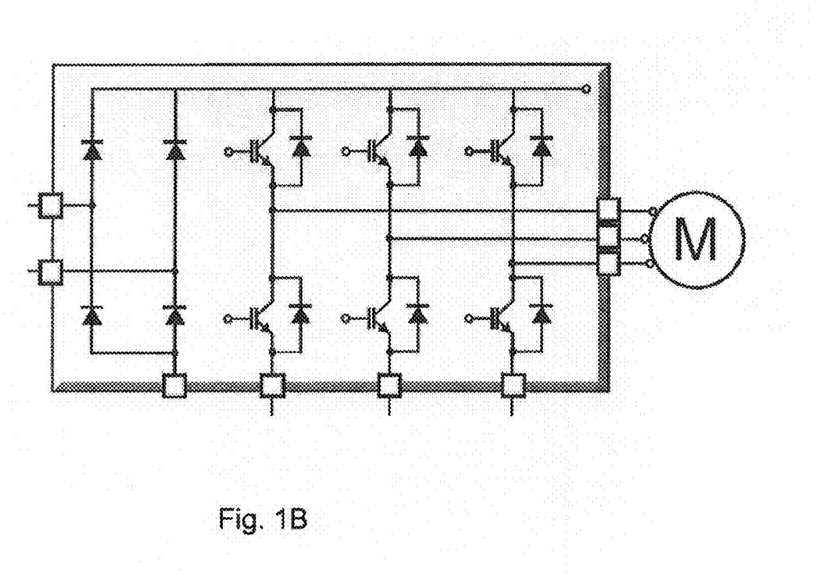
FIG. 1B shows an example of a prior art motor drive circuit.

FIG. 1B shows a fairly conventional motor drive circuit. Each of the phase legs of the motor comprises a "pull-up" and "pull-down" module, each of which is a MOS-controlled thyristor and diode in parallel. Conventionally, each diode and each thyristor are made in a separate semiconductor die. While it might seem desirable to combine the diode and thyristor on a single die for conservation of space and ease of manufacturing, this is surprisingly difficult. The present application presents, among other things, approaches for combining a controllable thyristor and a diode on a single semiconductor die.

FIGS. 2A-2B and FIGS. 3A-3B illustrate two embodiments of an innovative technique that can be used to realize the sample embodiment of FIG. 1A. In the sample embodiment of FIGS. 2A-2B, fabrication begins with N epitaxial layer 203 grown on P++ substrate 201. In the regions of the die where N+ material is desired (e.g., the region under rectifier 100B in the sample embodiment of FIG. 1A), trenches 230 are preferably etched entirely through substrate 201 and into, but not through, epitaxial layer 203.

Figure 2A:
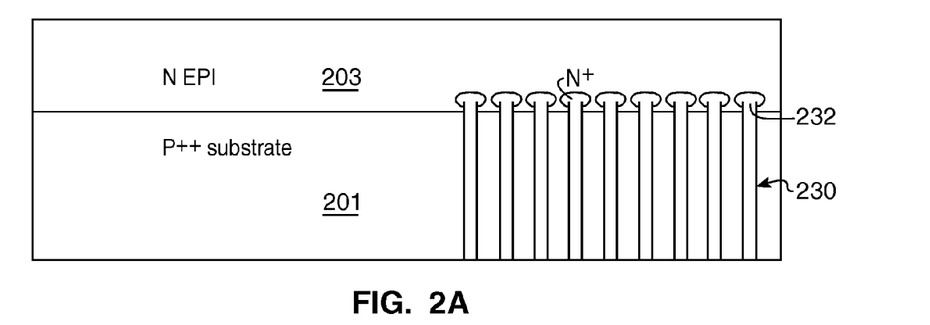
FIGS. 2A-2B and 3A-3B show several embodiments of innovative techniques that can be used in realizing the present innovations.

Following this etch step, N type material 232 is deposited in the trenches 230. This can consist of implanting N type dopant, or depositing phosphorus doped glass, N+ doped poly silicon, or other N+ doped material, followed by a diffusion step. If doped poly is used in this step, it will most likely be left in the trenches 230. The dopant will diffuse out of the poly into the silicon 203, and the doped poly forms a relatively low resistance path. If doped oxide is the doping source, the oxide can be left, or it can be removed after the diffusion and another more conductive material (e.g. a refractory metal) deposited in the trenches 230. This contact technique can also be used when dopant is implanted directly.

Figure 2B:
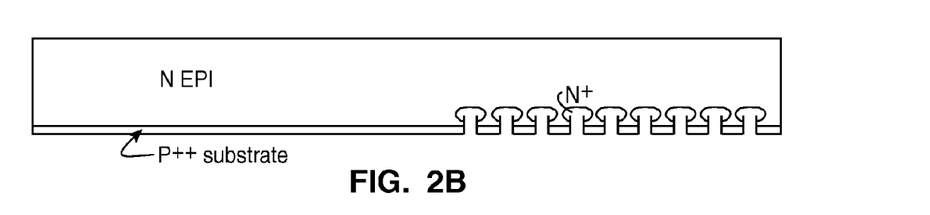

Following this step, the backside of the die is thinned, as seen in FIG. 2B, and backside metal is deposited. These steps can occur immediately after the doping of the trenches is completed, or can be completed at another point during the fabrication process.

Figure 3A:
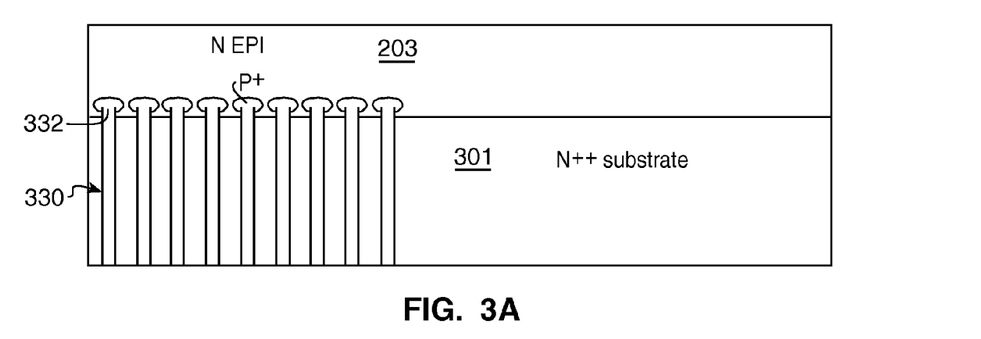
Figure 3B:
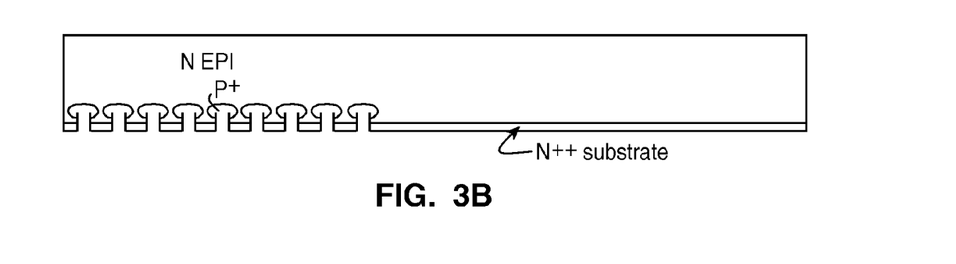

FIGS. 3A-3B show a complementary process to that of FIGS. 2A-2B, in which trenches 330 are pattern-etched through N++ substrate 301 and into N epi layer 203 in the region underlying (in the sample embodiment of FIG. 1A) thyristor 100A. P+ dopant is implanted, or P+ doped material is deposited, as P+ material 332. The alternative trench processes discussed above for FIGS. 2A-2B also apply equally well here.

Figure 4:
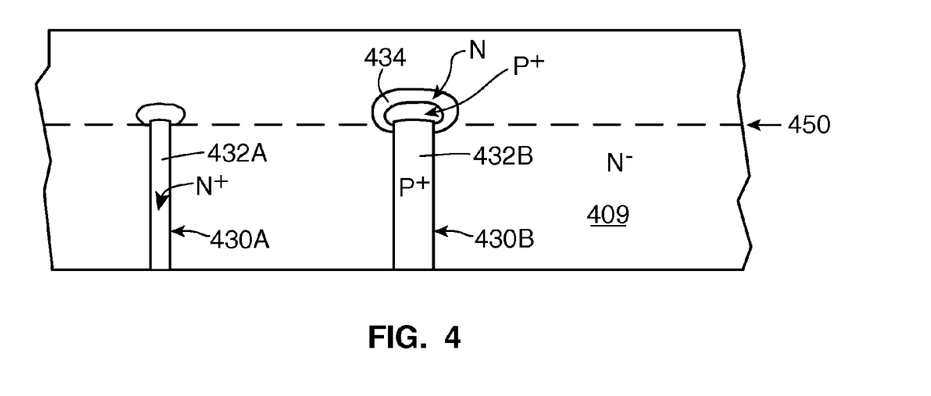
FIG. 4 shows another innovative technique that can be used in realizing the present inventions.

FIG. 4 shows an embodiment of another novel method that can be used to realize the present inventions, and which does not require an epitaxial wafer. In one sample embodiment, fabrication begins with a lightly-doped N-die 409. Trenches 430 are etched on the backside of the die with differing lateral dimensions. In this particular embodiment, trenches 430A underlie areas where N+ material is desired, and are narrower than trenches 430B, which underlie areas where P+ is desired. The depth of these trenches is selected to ensure that the desired voltage can be sustained over the thickness of silicon from the bottom of the trenches to the front face of the die.

N+ doped poly 432A is then deposited in all of trenches 430, in sufficient quantities that narrow trenches 430A are completely filled by the doped poly 432A, but wide trenches 430B are not filled, and only have the sides and bottoms coated with poly 432A. Next an isotropic etch is performed, which removes poly 432A from the back surface of the die and from trenches 430B, but as narrow trenches 430A are completely filled by poly 432A, the etch can remove only the surfaces of the poly 432A from trenches 430A. An n-type ion implant 434 is performed across the back of the die, doping the bottoms of wide trenches 430B, and a diffusion step is performed. P+ doped poly 432B is then deposited in wide trenches 430B. Poly 432B can completely fill trenches 430B, or can be supplemented by e.g. a refractory metal. The remaining poly 432B is etched from the back of the die, and the die is then ready for front-side processing, backside thinning, and backside metal deposition. However, note that the backside of the die must not be thinned beyond the dashed line (450) near the trench bottom.

Figure 5A:
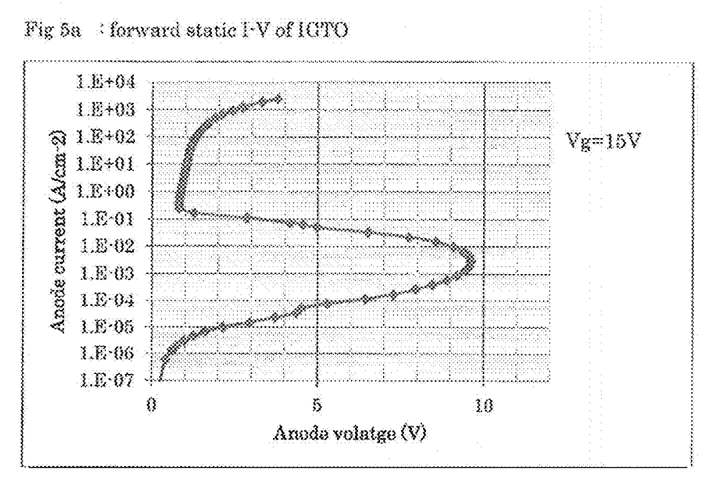
FIGS. 5A-5B show forward and reverse static I-V curves for an embodiment of the present inventions.
Figure 5B:
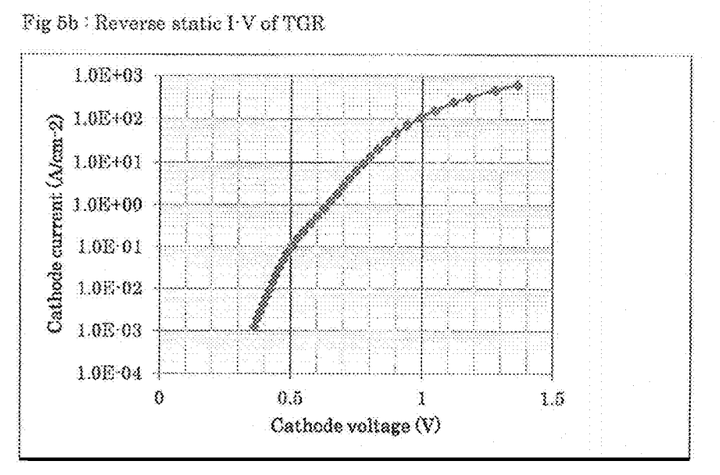

FIGS. 5A-5B show forward and reverse static I-V curves for an embodiment of the present inventions. These figures are an example of a 2D simulation result for a sample embodiment similar to that of FIG. 1A, wherein the MOS-controlled thyristor is an isolated gate turn-off thyristor (IGTO), as seen in e.g. copending application Ser. No. 13/632,991 filed Oct. 1, 2012. This simulation was performed using the Silvaco process/device simulator. In this simulation, the backside of the device is defined as the anode. A positive bias on the anode shows the forward device characteristic, while a negative bias on the anode shows the reverse device characteristic. FIG. 5A shows the forward static I-V curve, and FIG. 5B shows the reverse static I-V curve, for the IGTO of the present sample embodiment. As seen in these simulations, the I-V characteristics demonstrate excellent device performance for the monolithic IGTO and TGR of this sample embodiment.

Figure 6A:
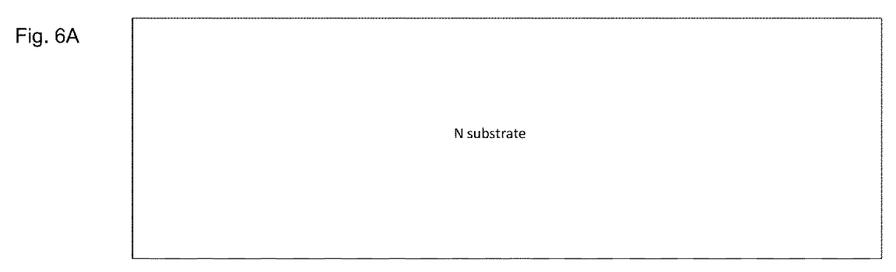
FIGS. 6A-6D show several embodiments of innovative techniques that can be used in realizing the present innovations.
Figure 6B:
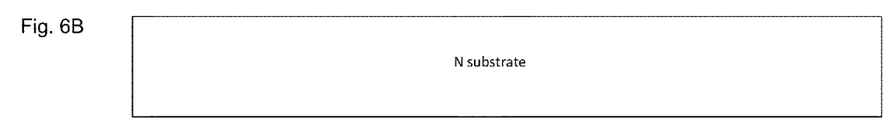
Figure 6C:
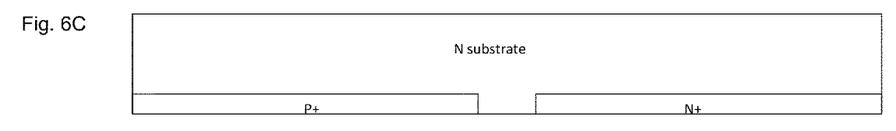
Figure 6D:
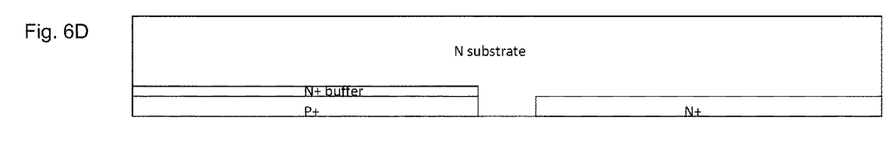

FIGS. 6A-6D show two sample embodiments of another novel method that can be used to realize the present inventions, and which does not require an epitaxial wafer. Fabrication begins as seen in FIG. 6A with a lightly-doped N-type wafer. Either before or after frontside processing is completed, the backside is thinned, e.g. by back grinding, as seen in FIG. 6B. The P+ and N+ backside regions are formed through ion implantation in the appropriate regions, as seen in FIG. 6C. Optionally, an N+ buffer layer can first be formed, also by ion implantation, as seen in FIG. 6D. FIGS. 6A and 6B are common to the two sample embodiments.

According to some but not necessarily all embodiments, there is provided: A method of manufacturing both a thyristor and also a high-current diode on a single semiconductor die, comprising: forming a heavily-doped first-conductivity-type region at a front surface of the semiconductor die, both in a thyristor location and also simultaneously in a diode location; forming trenches into the semiconductor die, both in the thyristor location and also simultaneously in the diode location; insulating said trenches; forming a second-conductivity-type base region, in said thyristor locations but not in said diode locations, which forms a junction with underlying first-conductivity-type semiconductor material at a depth which is deeper than said trenches; forming a second-conductivity-type body region, in at least said diode locations, which forms a junction with said underlying first-conductivity-type semiconductor material at a depth which is not significantly deeper than the bottoms of said trenches; after the insulating step or steps, forming a first gate electrode inside said trenches in the thyristor regions; and forming a second gate electrode which is not connected to said first gate electrode inside said trenches in the diode region; forming a heavily-doped first-conductivity-type backside contact region beneath said diode regions, and a heavily-doped second-conductivity-type backside contact region beneath said thyristor regions; and forming a first metallic layer which connects to said heavily-doped first-conductivity-type region in both thyristor and diode locations, and forming a second metallic layer which connects both to said heavily-doped first-conductivity-type backside contact region and also to said heavily-doped second-conductivity-type backside contact region.

According to some but not necessarily all embodiments, there is provided: A method of manufacturing both a thyristor and also a high-current diode on a single semiconductor die, comprising: forming a heavily-doped first-conductivity-type region at a front surface of the semiconductor die in a thyristor location; forming a heavily-doped first-conductivity-type region at a front surface of the semiconductor die in a diode location; forming trenches into the semiconductor die in the thyristor location; forming trenches into the semiconductor die in the diode location; insulating said trenches; wherein said insulating step is performed differently in said thyristor locations than in said diode locations; forming a second-conductivity-type base region, in said thyristor locations but not in said diode locations, which forms a junction with underlying first-conductivity-type semiconductor material at a depth which is deeper than said trenches; forming a second-conductivity-type body region, in at least said diode locations, which forms a junction with said underlying first-conductivity-type semiconductor material at a depth which is not significantly deeper than the bottoms of said trenches; after the insulating step or steps, forming a first gate electrode inside said trenches in the thyristor regions; and forming a second gate electrode which is not connected to first gate electrode inside said trenches in the diode region; forming a heavily-doped first-conductivity-type backside contact region beneath said diode regions, and a heavily-doped second-conductivity-type backside contact region beneath said thyristor regions; and forming a first metallic layer which connects to said heavily-doped first-conductivity-type region in both thyristor and diode locations, and forming a second metallic layer which connects both to said heavily-doped first-conductivity-type backside contact region and also to said heavily-doped second-conductivity-type backside contact region.

According to some but not necessarily all embodiments, there is provided: A method of manufacturing both a thyristor and also a high-current diode on a single semiconductor die, comprising: forming a heavily-doped first-conductivity-type region at a front surface of the semiconductor die in a thyristor location; forming a heavily-doped first-conductivity-type region at a front surface of the semiconductor die in a diode location; forming trenches into the semiconductor die, both in the thyristor location and also simultaneously in the diode location; insulating said trenches; forming a second-conductivity-type base region, in said thyristor locations but not in said diode locations, which forms a junction with underlying first-conductivity-type semiconductor material at a depth which is deeper than said trenches; forming a second-conductivity-type body region, in at least said diode locations, which forms a junction with said underlying first-conductivity-type semiconductor material at a depth which is not significantly deeper than the bottoms of said trenches; after the insulating step or steps, forming a first gate electrode inside said trenches in the thyristor regions; and forming a second gate electrode which is not connected to first gate electrode inside said trenches in the diode region; forming a heavily-doped first-conductivity-type backside contact region beneath said diode regions, and a heavily-doped second-conductivity-type backside contact region beneath said thyristor regions; and forming a first metallic layer which connects to said heavily-doped first-conductivity-type region in both thyristor and diode locations, and forming a second metallic layer which connects both to said heavily-doped first-conductivity-type backside contact region and also to said heavily-doped second-conductivity-type backside contact region.

According to some but not necessarily all embodiments, there is provided: A method of manufacturing both a thyristor and also a high-current diode on a single semiconductor die, comprising: forming a heavily-doped first-conductivity-type region at a front surface of the semiconductor die, both in a thyristor location and also simultaneously in a diode location; forming trenches into the semiconductor die in the thyristor location; forming trenches into the semiconductor die in the diode location; insulating said trenches; forming a second-conductivity-type base region, in said thyristor locations but not in said diode locations, which forms a junction with underlying first-conductivity-type semiconductor material at a depth which is deeper than said trenches; forming a second-conductivity-type body region, in at least said diode locations, which forms a junction with said underlying first-conductivity-type semiconductor material at a depth which is not significantly deeper than the bottoms of said trenches; after the insulating step or steps, forming a first gate electrode inside said trenches in the thyristor regions; and forming a second gate electrode which is not connected to first gate electrode inside said trenches in the diode region; forming a heavily-doped first-conductivity-type backside contact region beneath said diode regions, and a heavily-doped second-conductivity-type backside contact region beneath said thyristor regions; and forming a first metallic layer which connects to said heavily-doped first-conductivity-type region in both thyristor and diode locations, and forming a second metallic layer which connects both to said heavily-doped first-conductivity-type backside contact region and also to said heavily-doped second-conductivity-type backside contact region.

According to some but not necessarily all embodiments, there is provided: A method of forming a trench thyristor and a trench-gate rectifier structure on the same semiconductor die, comprising: depositing an n-type semiconductor layer over a heavily-doped P-type semiconductor substrate; forming trenches on the backside of said die under the rectifier; wherein said trenches extend through said substrate and into, but not through, said epitaxial layer; introducing donor dopants through said trenches; processing the front side of said die to form said thyristor and rectifier; thinning the backside of said die; and depositing metal on the backside of said die.

According to some but not necessarily all embodiments, there is provided: A method of forming a trench thyristor structure and a trench rectifier structure on the same semiconductor die, comprising: depositing an additional n-type semiconductor layer over a heavily-doped N++ substrate; forming trenches on the back side of said die beneath locations of the trench thyristor structure but not beneath locations of the trench rectifier structure; wherein said trenches extend through said substrate and into, but not through, said epitaxial layer; introducing acceptor dopants through said trenches; processing the front side of said die to form said thyristor and rectifier; thinning the backside of said die; and depositing metal on the backside of said die.

According to some but not necessarily all embodiments, there is provided: A method of combining a first-conductivity-type backside contact region and a second-conductivity-type backside contact region on a single semiconductor die, comprising: in a lightly-doped first-conductivity-type die having a first region where said first-conductivity-type backside contact region is desired and a second region where said second-conductivity-type backside contact region is desired, forming trenches on the back of said die; wherein ones of said trenches in said first region have a lateral dimension that is smaller than a lateral dimension of ones of said trenches in said second region; depositing first-conductivity-type doped material in said trenches; wherein said material completely fills said first trenches, and wherein said material does not completely fill said second trenches; removing said material from the back of said die, wherein said removing does not remove said material from said first trenches; performing a first-conductivity-type ion implant across the back of said die, and then performing a diffusion; depositing second-conductivity-type doped material in said second trenches; and removing any excess material from the back of said die.

According to some but not necessarily all embodiments, there is provided: A method of semiconductor manufacturing, comprising: in a semiconductor die having a first-conductivity-type bulk of semiconductor material, forming, on the frontside thereof, both a first device which uses bipolar conduction and requires a second-conductivity-type backside contact region, and also a second device which uses only unipolar conduction and requires a first-conductivity-type backside contact region; providing a heavy doping on the backside of said die, under at least one of said first and second devices; forming trenches on the backside of said die underlying only the other of said first and second devices; introducing semiconductor dopant through said trenches, in sufficient quantity that both said first and second devices have respective heavily-doped backside contact regions; and forming metallization which makes a connection between both said backside contact regions.

According to some but not necessarily all embodiments, there is provided: A method of manufacturing a first and second device on a single semiconductor die, comprising: in a semiconductor die having a first layer of semiconductor material over a heavily-doped first-conductivity-type substrate, wherein said first device uses fully bipolar conduction and requires a first-conductivity-type backside contact region, and said second device uses only unipolar conduction and requires a second-conductivity-type backside contact region; forming trenches on the back of said die underlying the region of said second device, wherein said trenches extend completely through said substrate and into, but not through, said first layer; depositing second-conductivity-type doped material in said trenches underlying said second device; and processing the front side of said die to complete said first and second devices.

According to some but not necessarily all embodiments, there is provided: A method of forming a trench thyristor structure and a trench rectifier structure on a lightly-doped n-type semiconductor die, comprising: forming trenches on the back surface of said die, said trenches extending partially through said die; wherein the ones of said trenches underlying said thyristor have a wider lateral dimension than the ones of said trenches underlying said rectifier; depositing N+ doped material in said trenches, wherein said doped material completely fills the trenches underlying the rectifier, but only coats the walls of the trenches underlying the thyristor; removing said N+ doped material from the backside of said die; depositing P+ doped material to fill the trenches underlying the thyristor; removing said P+ doped material from said die backside; and performing frontside processing to form said thyristor and rectifier.

According to some but not necessarily all embodiments, there is provided: A method of forming a trench thyristor structure and a trench rectifier structure on a lightly-doped n-type semiconductor die, comprising: forming trenches on the back surface of said die, said trenches extending partially through said die; wherein the ones of said trenches underlying said thyristor have a narrower lateral dimension than the ones of said trenches underlying said rectifier; depositing P+ doped material in said trenches, wherein said doped material fills the trenches underlying the thyristor, but only coats the walls of the trenches underlying the rectifier; performing an isotropic etch to remove said P+ doped material from the backside of the die; depositing N+ doped material to fill the trenches underlying the rectifier; removing said N+ doped material from the backside of the die; and performing frontside processing to form said thyristor and rectifier.

According to some but not necessarily all embodiments, there is provided: A method of semiconductor manufacturing, comprising: in a semiconductor die with substantially uniform first-conductivity-type doping, forming, on the frontside thereof, both a first device which is controlled by a trench gate and uses bipolar conduction and has a shallow heavily-doped first-conductivity-type diffusion in active areas thereof, and also a second device which uses a trench gate and uses only unipolar conduction and has a shallow heavily-doped first-conductivity-type diffusion in active areas thereof; forming a first metallization, which electrically connects said shallow heavily-doped first-conductivity-type diffusions in both said first and said second devices together; forming a heavily-doped second-conductivity-type backside contact region on the backside of said die, under said first device, and forming a heavily-doped first-conductivity-type backside contact region on the backside of said die under second device; and forming a second metallization which connects said first-conductivity-type heavily-doped backside contact region to said second-conductivity-type backside contact region.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Note that polarity can be reversed as desired, although in silicon, the difference in mobility between electrons and holes means that the trench gates are more preferably close to the n+ diffusion side of the device rather than the p+ side of the device. Similarly, conduction in the diode is preferably by electrons. However, the ratio of mobilities is different in other semiconductors, and in silicon-germanium or silicon or germanium or other group IV or III-V or other semiconductor materials, polarities can be reversed with appropriate doping changes.

The thickness and doping concentration of the drift region (preferably n−) defines the breakdown voltage which the device can withstand.

The thickness and doping of the drift region can be adjusted to achieve the best contact resistance ($\Omega \cdot cm^2$) in the ON state. Similarly, the depth of the well which provides the p-base in the thyristor structure can also be adjusted. The doping of this layer can similarly be adjusted to provide the required predictable turn-on, together with whatever voltage withstand value is required.

In the most preferred embodiment, the gate oxides are different for the MOS-controlled thyristor and for the trench-gated diode. That oxide thickness is used because the diode gate oxide can be exposed to higher voltages. Generally, in the on state, the initiation of latchup will produce a low voltage drop on the thyristor side, but the diode will typically not have as much conductance per unit area when it is in the on state. In another embodiment, however, the gate oxides can be identical for the MOS-controlled thyristor and for the trench-gated diode.

Both gated electrodes preferably lie entirely within the trenches, but alternatively the gate electrode in the thyristor regions, at least, can be formed with a "nail head" top.

In the most preferred embodiment, the trenches are formed at the same time for the thyristor and for the diode. However, in less preferred embodiments, the trenches can be formed at different times.

In one less-preferred embodiment, the N+ emitter regions for the thyristor are not formed at the same time as the N+ anode regions for the diode.

In the most preferred embodiment, the diode is a trench gate rectifier. However, other diode structures can be used in less-preferred embodiments.

Since lifetime control is generally used, the lifetime of the minority carriers in the diode will usually be short. The goal is almost always to have a fast diode turn-off.

The MOS-controlled thyristor is most preferably an isolated gate turn-off thyristor (IGTO), but less preferred embodiments can include other MOS-controlled thyristor structures in place of an IGTO.

In one envisioned embodiment, lifetime control can be different for the thyristor and the diode.

While the device shown in FIG. 1A segregates the thyristor and the diode such that each has its own guard structure, in one alternative embodiment the termination structures can be common to the diode and the thyristor in part or in whole.

In one envisioned embodiment, it is possible to recess the gate electrodes slightly, or to have them protrude slightly, as long as they are insulated from the anode and cathode metals.

For simplicity, contact between metallization and semiconductor areas has been shown as a direct ohmic contact. However, in various alternative embodiments, a barrier metallization can be used, or additional metal layers can be used at a contact location.

In addition, as will be recognized by those of ordinary skill in the art of semiconductor devices, additional implant and/or diffusion steps can be used to achieve graded dopings. Thus, if desired, multiple implants can be used, for example, to form the p-base shown in FIG. 1A as 105.

Note also that in an alternate embodiment of the sample embodiment of FIG. 4, ion implant 434 is not critical if a P+ substrate with an n-type buffer layer is used. If an n-type, non-epitaxial starting die is used, the amount of n-type dopant controls the relative injection efficiency of the p-type region below it. The n-type region 434 may not be needed, depending on the p-type doping concentration and the percentage of the area of the injecting region.

In the sample embodiment of e.g. FIGS. 6A-6D, ion implantation can be performed using color reversal.

In one alternate embodiment, gate material can be silicided.

Note that the integrated device structure shown here is particularly advantageous not only for motor drives as shown in FIG. 1B, but also for some solenoids and power supply circuits where a flyback diode is useful.

Note that the diode structure differs from that of the thyristor not only in the absence of the p+ backside region, but also in the absence of the deep p well which provides the top base region of the MOS-controlled thyristor. It is also possible to perform pattern dopings so that the doping profile at the front surface is different in the diode area.

Additional general background, which helps to show variations and implementations, may be found in the following publications, all of which are hereby incorporated by reference: Issued U.S. Pat. No. 7,705,368 to Rodov and Akiyama, which is commonly owned with the present application; Baliga, *Fundamentals of Power Semiconductor Devices*; Carr, *DC Power Supplies: A Technician's Guide* (1996); Jowett, *Electronic devices in industry* (1984); Bird, *Introduction to Power Electronics* (1983); Shah, *Simplifying Power Supply Technology* (1995); Wood, *Switching power converters* (1984); Dewan and Straughen, *Power semiconductor circuits* (1975); Billings, *Handbook of switchmode power supplies* (1989); IEEE PES conference proceedings (all years); Gottlieb, *Power Supplies, Switching Regulators, Inverters, and Converters* (1993); Wu, *Pulse Width Modulated DC/DC Converters* (1997); Mohan et al., *Power Electronics: Converters, Applications, and Design* (2.ed.1995); Oxner, *Designing with Field Effect Transistors* (1989); *High voltage integrated circuits* (1988); Billings, *Switchmode Power Supply Handbook* (2.ed.1998); Trzynadlowski, *Introduction to Modern Power Electronics* (1998); Antognetti, *Power integrated circuits* (1986); Schwarz, *Design of industrial electric motor drives* (1991); Pressman, *Switching power supply design* (1991); Middlebrook and Slobodan Cuk, *Advances in switched-mode power conversion* (Vols. 1+2 together, and volume 3) (1981); ISPSD conference proceedings (all years). All of these publications are hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, copendency, and inventorship with the present application, and all of them are hereby incorporated by reference: Ser. No. 13/632,991 filed Oct. 1, 2012; 61/540,819 filed Oct. 1, 2011; 61/547,355 filed Oct. 14, 2011; 61/678,724 filed Aug. 2, 2012; 61/678,729 filed Aug. 2, 2012; 61/708,048 filed Oct. 1, 2012; 61/708,049 filed Oct. 1, 2012. Applicants reserve the right to claim priority from these applications, in any and all countries where such priority can be claimed.

The claims as filed are intended to be as comprehensive as possible, and NO subject matter is intentionally relinquished, dedicated, or abandoned.

What is claimed is:

1. A method of manufacturing both a thyristor and also a high-current diode on a single semiconductor die, comprising:
    forming a heavily-doped first-conductivity-type region at a front surface of the semiconductor die, both in a thyristor location and also simultaneously in a diode location;
    forming trenches into the semiconductor die, both in the thyristor location and also simultaneously in the diode location;
    insulating said trenches;
    forming a second-conductivity-type base region, in said thyristor location but not in said diode location, which forms a junction with underlying first-conductivity-type semiconductor material at a depth which is deeper than said trenches;
    forming a second-conductivity-type body region, in at least said diode location, which forms a junction with said underlying first-conductivity-type semiconductor material at a depth which is not significantly deeper than the bottoms of said trenches;
    after the insulating step, forming a first gate electrode inside said trenches in the thyristor location, and forming a second gate electrode which is not connected to said first gate electrode inside said trenches in the diode location;
    forming a heavily-doped first-conductivity-type backside contact region beneath said diode location, and a heavily-doped second-conductivity-type backside contact region beneath said thyristor location; and
    forming a first metallic layer which connects to said heavily-doped first-conductivity-type region in both the thyristor location and diode location, and forming a second metallic layer which connects to both said heavily-doped first-conductivity-type backside contact region and also to said heavily-doped second-conductivity-type backside contact region.

2. The method of claim 1, wherein said first metallic layer makes ohmic contact directly to said heavily-doped first-conductivity-type region in both thyristor and diode locations.

3. The method of claim 1, wherein said second metallic layer makes ohmic contact directly to said heavily-doped first-conductivity-type backside contact region and also to said heavily-doped second-conductivity-type backside contact region.

4. The method of claim 1, wherein said first conductivity type is n-type.

5. The method of claim 1, wherein each said heavily-doped region has a peak doping greater than $10^{18}$ cm$^{-3}$.

6. The method of claim 1, wherein said underlying first-conductivity-type semiconductor material has a doping of less than $10^{16}$ cm$^{-3}$.

7. The method of claim 1, wherein said underlying first-conductivity-type semiconductor material has a doping in the range of about $10^{13}$ cm$^{-3}$ to $10^{15}$ cm$^{-3}$.

8. The method of claim 1, wherein said steps of forming a heavily-doped first-conductivity-type backside contact region beneath said diode location, and forming a heavily-doped second-conductivity-type backside contact region beneath said thyristor location, are performed by using a starting material which has said underlying first-conductivity-type semiconductor material as an epitaxial layer over a heavily-doped second-conductivity-type semiconductor substrate, and etching holes through said heavily-doped second-conductivity-type semiconductor substrate into said epitaxial layer, and introducing additional first-conductivity-type dopants into said epitaxial layer through said holes.

9. The method of claim 1, wherein said steps of forming a heavily-doped first-conductivity-type backside contact region beneath said diode location, and forming a heavily-doped second-conductivity-type backside contact region beneath said thyristor location, are performed by using a starting material which has said underlying first-conductivity-type semiconductor material as an epitaxial layer over a heavily-doped first-conductivity-type semiconductor substrate, and etching holes through said heavily-doped first-conductivity-type semiconductor substrate into said epitaxial layer beneath the thyristor location, and introducing second-conductivity-type dopants into said epitaxial layer through said holes.

10. The method of claim 1, wherein said steps of forming a heavily-doped first-conductivity-type backside contact region beneath said diode location, and forming a heavily-doped second-conductivity-type backside contact region beneath said thyristor location, are performed by using a lightly-doped starting material which has said underlying first-conductivity-type semiconductor material, and etching holes through some but not all of said starting material, wherein the holes beneath the thyristor location have a larger lateral dimension than that of the holes beneath the diode location, and introducing first-conductivity-type-doped material to fill said holes beneath the diode location but only to coat the walls and bottoms of said holes beneath the thyristor location, and removing said doped material from the holes beneath the thyristor location but not removing said doped material from the holes beneath the diode location, and introducing second-conductivity-type-doped material into the holes beneath the thyristor location.

11. The method of claim 10, further comprising introducing first-conductivity-type dopants into the holes beneath the thyristor location before introducing the second-conductivity-type-doped material into said holes.

12. The method of claim 1, wherein said steps of forming a heavily-doped first-conductivity-type backside contact region beneath said diode location, and forming a heavily-doped second-conductivity-type backside contact region beneath said thyristor location, are performed by using a lightly-doped starting material which has said underlying first-conductivity-type semiconductor material, and etching holes through some but not all of said starting material, wherein the holes beneath the thyristor location have a smaller lateral dimension than that of the holes beneath the diode location, and introducing second-conductivity-type-doped material to fill said holes beneath the thyristor location but only to coat the walls and bottoms of said holes beneath the diode location, and removing said doped material from the holes beneath the diode location but not removing said doped material from the holes beneath the thyristor location, and introducing first-conductivity-type-doped material into the holes beneath the diode location.

13. The method of claim 1, wherein at least part of the insulating step is performed by simultaneous oxidation on both the thyristor location and the diode location.

14. The method of claim 1, wherein said semiconductor material consists essentially of silicon.

15. The method of claim 1, wherein the top of said first gate electrode is covered by insulating material, and the top of said second gate electrode in said diode location is not.

16. The method of claim 1, wherein said first gate electrode lies entirely inside the trench, in at least the thyristor location.

17. The method of claim 1, wherein said second gate electrode lies entirely inside the trench.

18. The method of claim 1, wherein said step of forming a second-conductivity-type body region forms a junction with said underlying first-conductivity-type semiconductor material at a depth which is less than 70% of the depth of the bottoms of said trenches in the diode location.

19. A method of manufacturing both a thyristor and also a high-current diode on a single semiconductor die, comprising:
- forming a heavily-doped first-conductivity-type region at a front surface of the semiconductor die in a thyristor location;
- forming a heavily-doped first-conductivity-type region at a front surface of the semiconductor die in a diode location;
- forming trenches into the semiconductor die in the thyristor location;
- forming trenches into the semiconductor die in the diode location;
- insulating said trenches, wherein said insulating step in said thyristor location is performed differently than in said diode location;
- forming a second-conductivity-type base region, in said thyristor location but not in said diode location, which forms a junction with underlying first-conductivity-type semiconductor material at a depth which is deeper than said trenches;
- forming a second-conductivity-type body region, in at least said diode location, which forms a junction with said underlying first-conductivity-type semiconductor material at a depth which is not significantly deeper than the bottoms of said trenches;
- after the insulating step, forming a first gate electrode inside said trenches in the thyristor location, and forming a second gate electrode which is not connected to first gate electrode inside said trenches in the diode location;
- forming a heavily-doped first-conductivity-type backside contact region beneath said diode location, and a heavily-doped second-conductivity-type backside contact region beneath said thyristor location; and
- forming a first metallic layer which connects to said heavily-doped first-conductivity-type region in both the thyristor location and diode location, and forming a second metallic layer which connects to both said heavily-doped first-conductivity-type backside contact region and to said heavily-doped second-conductivity-type backside contact region.

20. A method of manufacturing both a thyristor and also a high-current diode on a single semiconductor die, comprising:
- forming a heavily-doped first-conductivity-type region at a front surface of the semiconductor die in a thyristor location;
- forming a heavily-doped first-conductivity-type region at a front surface of the semiconductor die in a diode location;
- forming trenches into the semiconductor die, both in the thyristor location and also simultaneously in the diode location;
- insulating said trenches;
- forming a second-conductivity-type base region, in said thyristor location but not in said diode location, which forms a junction with underlying first-conductivity-type semiconductor material at a depth which is deeper than said trenches;
- forming a second-conductivity-type body region, in at least said diode location, which forms a junction with said underlying first-conductivity-type semiconductor material at a depth which is not significantly deeper than the bottoms of said trenches;
- after the insulating step, forming a first gate electrode inside said trenches in the thyristor location; and forming a second gate electrode which is not connected to first gate electrode inside said trenches in the diode location;
- forming a heavily-doped first-conductivity-type backside contact region beneath said diode location, and a heavily-doped second-conductivity-type backside contact region beneath said thyristor location; and
- forming a first metallic layer which connects to said heavily-doped first-conductivity-type region in both the thyristor location and diode location, and forming a second metallic layer which connects to both said heavily-doped first-conductivity-type backside contact region and also to said heavily-doped second-conductivity-type backside contact region.

* * * * *